United States Patent [19] [11] 4,062,617
Johnson [45] Dec. 13, 1977

[54] ELECTRICAL TEST CONNECTOR APPARATUS

[75] Inventor: Lennart B. Johnson, Milford, N.H.

[73] Assignee: Teradyne, Inc., Boston, Mass.

[21] Appl. No.: 771,953

[22] Filed: Feb. 25, 1977

Related U.S. Application Data

[63] Continuation of Ser. No. 623,549, Oct. 17, 1975, abandoned.

[51] Int. Cl.² ............................................. H01R 13/54
[52] U.S. Cl. ............................. 339/75 M; 339/252 R
[58] Field of Search .................................. 339/64–66, 339/75, 252

[56] References Cited

U.S. PATENT DOCUMENTS

| 2,755,450 | 7/1956 | Chapman | 339/64 M |
|---|---|---|---|
| 2,972,728 | 2/1961 | Cole | 339/64 M |
| 3,295,097 | 12/1966 | Van Horssen et al. | 339/252 R |
| 3,315,212 | 4/1967 | Peterson | 339/75 M |
| 3,489,986 | 1/1970 | Frederick | 339/75 M |
| 3,569,905 | 3/1971 | Kehagioglou | 339/75 MP |
| 3,676,832 | 7/1972 | Judge et al. | 339/75 M |
| 3,725,853 | 4/1973 | McKeown et al. | 339/252 R |
| 3,763,459 | 10/1973 | Millis | 339/75 M |

FOREIGN PATENT DOCUMENTS

| 1,270,647 | 6/1968 | Germany | 339/75 R |
|---|---|---|---|
| 686,380 | 3/1965 | Italy | 339/75 M |

OTHER PUBLICATIONS

IBM Bulletin, Bruder, Insertion/Extraction Test Socket, 10/1970, p. 1265, vol. 13, No. 5.
IBM Bulletin, Buych et al. 7/1976, pp. 432 & 433, vol. 19, No. 2.

Primary Examiner—Joseph H. McGlynn

[57] ABSTRACT

A tester for backplanes, printed wiring boards and like electrical assemblies has contacts that mate without interference with contacts of the assembly under test, and has a displacement mechanism that shifts the assembly laterally. The lateral displacement brings the mated contacts into interfering engagement with each other for effecting electrical connection between them.

1 Claim, 8 Drawing Figures

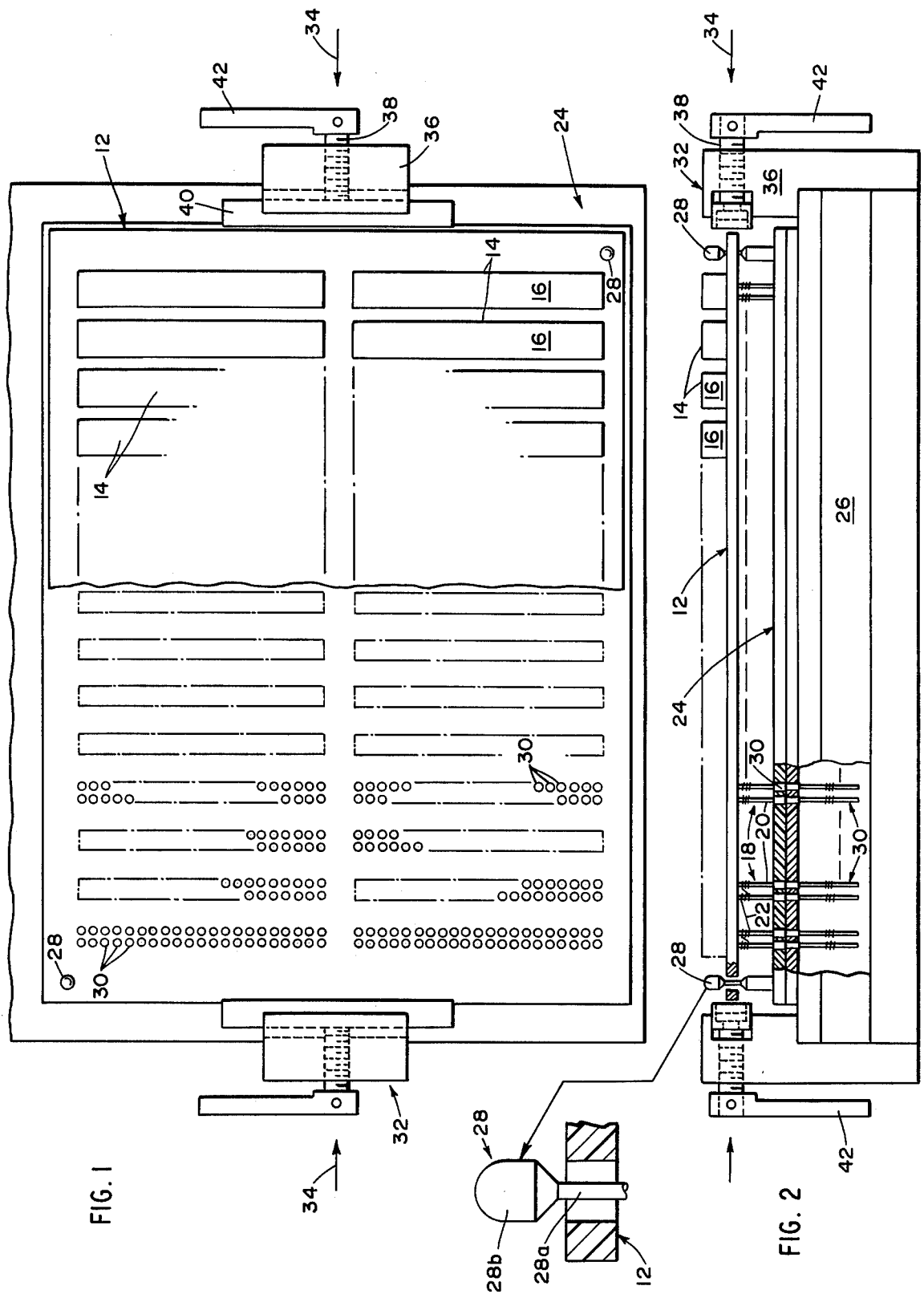

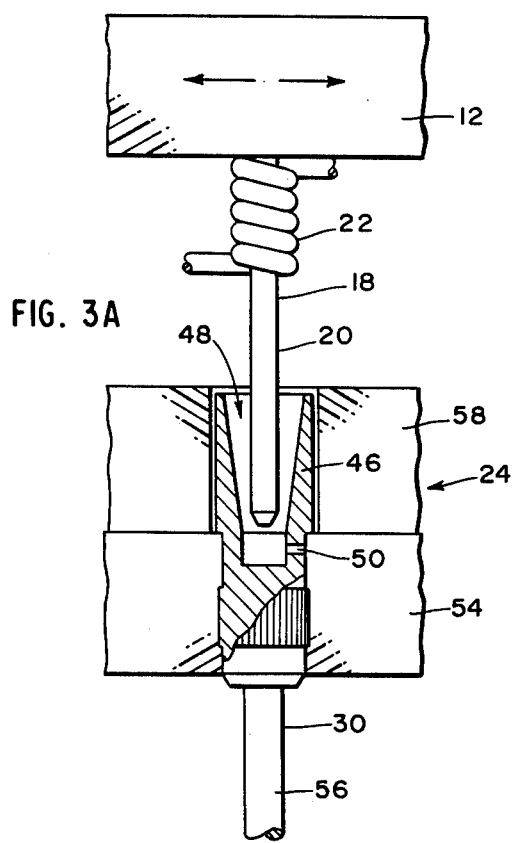
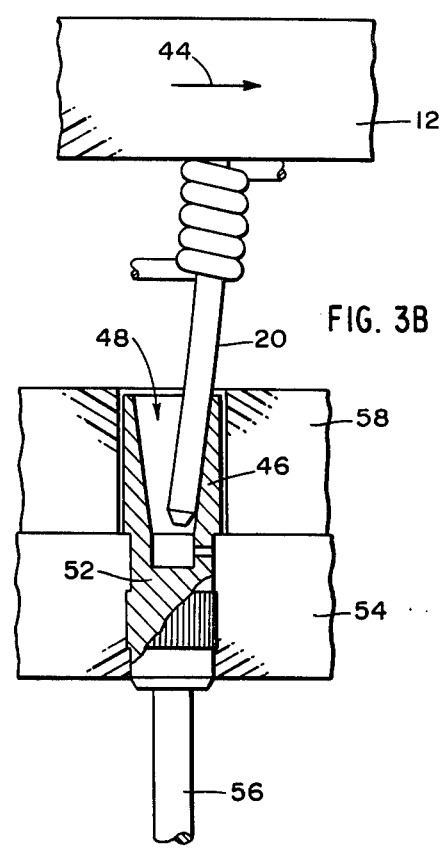
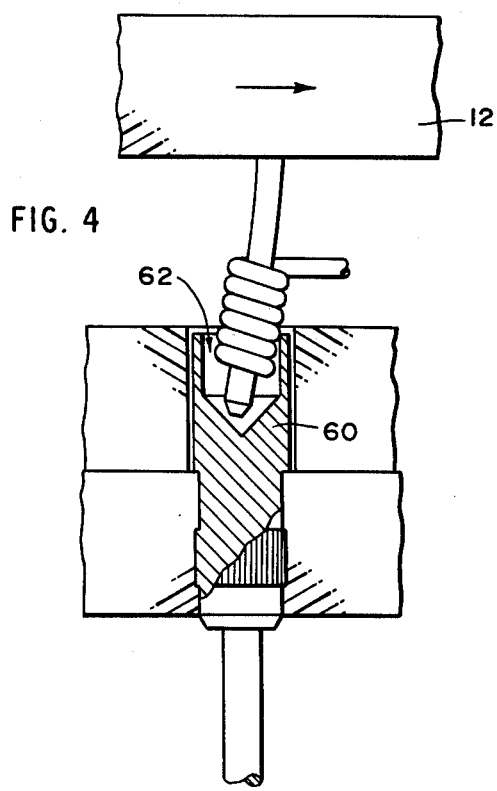
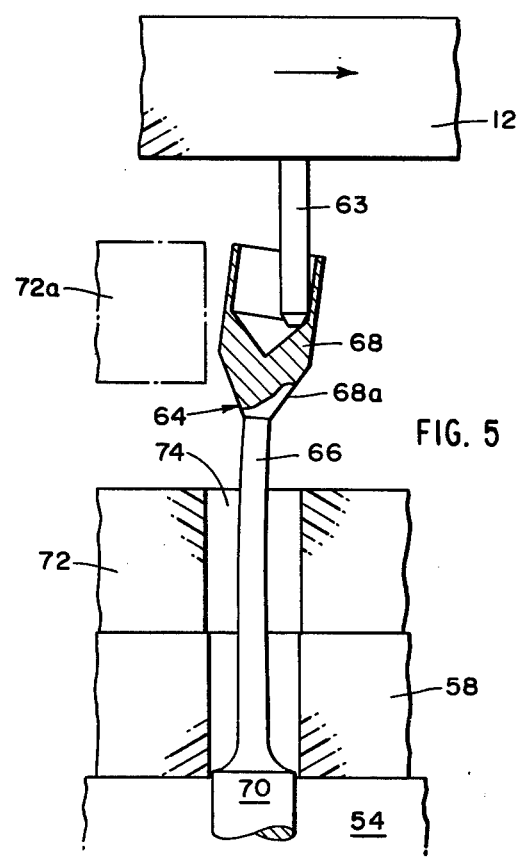

ELECTRICAL TEST CONNECTOR APPARATUS

This is a continuation of Application Ser. No. 623,549, filed Oct. 17, 1975, now abandoned.

BACKGROUND OF THE INVENTION

This invention relates to electrical connector apparatus useful for interconnecting test equipment to an electrical assembly such as a printed wiring board or a backplane.

The invention resolves the problem of the high force heretofore required to connect an electrical assembly to a test fixture. An electrical assembly such as a printed wiring board or a backplane typically has a large number of contacts. The conventional practice is to force these contacts into engagement with mating interference contacts of the test equipment. This, however, requires a high force, and a correspondingly high force usually is required to disconnect the assembly after the test. These high forces are cumbersome to apply. Moreover, the forces subject the equipment and particularly the assembly under test to potentially damaging stresses. This is because the forces are directed in the direction in which a circuit board or a backplane has relatively little strength, i.e. in the direction transverse to the lateral dimensions of these structures.

The prior art expedient of separating the contacts of the test equipment into several separate connectors, each of which requires only a fraction of the total force for engagement, is disadvantageous because each connector must be wired to the test equipment by a cable. A further drawback is that hooking up the several connectors prior to the test, and disconnecting them afterwards, unduly increases the time and hence the cost required for a test.

Accordingly, it is an object of this invention to provide an electrical test contact than can be connected with, and disconnected from, an assembly under test with relatively small applied force.

Another object of the invention is to provide an electrical interconnecting fixture to which a multi-contact electrical assembly can be connected, and from which it can be disconnected, without subjecting the assembly to undue stress.

It is also an object of the invention to provide apparatus of the above character that can be fabricated at relatively low cost.

Other objects of the invention will appear hereinafter.

SUMMARY OF THE INVENTION

In accordance with the invention, an interconnecting fixture for test equipment has electrical contacts that telescopically interfit, without interference and hence with minimal applied force, with contacts of the asssembly to be tested. A displacement mechanism on the fixture is then operated to move the test assembly in a lateral direction, e.g. where the test assembly is a printed wiring board, in the plane of the board. The lateral displacement brings the mated contacts into interfering engagement with each other and hence into electrical contact.

Where the contacts of the assembly being tested are male elements such as conventional wire-wrap pins, the test fixture seatingly receives each pin in a cup-shaped contact. Upon displacement on the assembly, each pin bears against the wall of the cup configuration to effect the desired contact. Conversely, where the assembly is a circuit board having plated-through holes or other socket type (female) contacts, the test fixture has pins that freely extend within the holes and engage the conductive plating of the holes upon displacement of the circuit board.

The interference-free initial engagement of the test fixture contacts with the contacts of the electrical assembly requires essentially no applied force: the backplane or printed wiring board to be tested typically is simply placed on a horizontal test fixture. Any one of a number of relatively elementary mechanical movements can be used to shift the backplane or plated wire board, once it is seated on the fixture, in a lateral direction to provide the offset that brings the contacts into electrical engagement. The lateral displacement force is in the direction where the assembly has significant strength, e.g. parallel to a planar backplane and to a circuit board. Hence, it does not subject the assembly to potentially damaging stresses.

Further, the engagement of the mated contacts, i.e. between the contacts of the test fixture and of the assembly under test, has significant resilience and is made with a wiping action as desired for reliable electrical connection. Where the contacts of the assembly are wire-wrap pins or the like, the resiliency can result from the flexibility of the pins themselves. On the other hand, where the pins or other male contacts of the assembly are stiff, or where the contacts of the assembly being tested are plated-through holes or the like, the resiliency is readily provided by the use of flexible contacts on the test fixture.

The invention accordingly comprises the features of construction, combination of elements, and arrangement of parts exemplified in the constructions hereinafter set forth, and the scope of the invention is indicated in the claims.

BRIEF DESCRIPTION OF DRAWINGS

For a fuller understanding of the nature and objects of the invention, reference should be had to the following detailed description and the accompanying drawings, in which:

FIG. 1 is a plan view, partly broken away, of an electrical backplane seated on an interconnecting test fixture in accordance with the invention;

FIG. 2 is a side elevation view, partly broken away, of the assemblage of FIG. 1;

FIGS. 3A and 3B are enlarged fragmentary side elevation views of a cup-like socket contact embodying the invention;

FIGS. 4 and 5 are views similar to FIG. 3 illustrating alternative constructions.

DESCRIPTION OF ILLUSTRATED EMBODIMENTS

Figure 6A:
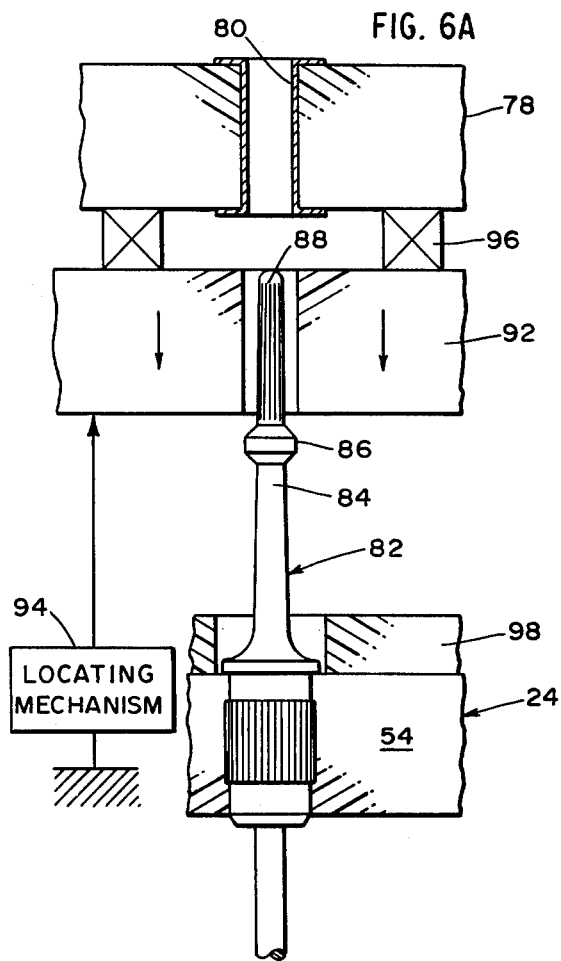
FIGS. 6A and 6B are fragmentary side elevation views partly broken away of test fixture having a pin contact in accordance with the invention.

FIGS. 1 and 2 show a conventional electrical assembly in the form of a backplane 12 carrying circuit card receptacles 14—14. Each receptacle has an insulating housing 16 fitted with contacts 18—18 that, above the backplane, electrically connect with a circuit card (not shown) plugged into the receptacle. Each contact 18 extends below the backplane with a male contact element in the form of a wire-wrap pin 20, to which connecting wires 22 are wrapped.

The backplane 12 is seated on an interconnecting fixture 24 of a test instrument 26, which can be any one of numerous presently-available commercial products. Guide pins 28 position the backplane, as it is being seated, relative to the test fixture so that the contact pins 20 initially are aligned with mating socket contacts 30 which the test fixture carries. The guide pins thus impose an initial aligned or normal location on the assembly to be tested relative to the test fixture.

However, the guide pins also accommodate a small lateral shift of the assembly under test from the normal, initially aligned, position. For this purpose, the diameter of each guide pin is reduced in a stem section 28a which is at the level of the assembly when fully seated on the fixture. That is, each guide pin has an uppermost alignment section 28b that snugly fits within alignment holes through the backplane 12 to receive the backplane on the test fixture and guide the contacts 18 thereof into engagement with the contacts 30 of the fixture. Below this upper section is the stem section 28a, which fits within the alignment holes with sufficient clearance so that the backplane can be shifted relative thereto without interference.

A displacement mechanism 32 is mounted to the fixture 24 at each of two opposite sides of the backplane 12. Each displacement mechanism can shift the backplane, from the normal position, relative to the test fixture in the direction of its adjacent arrow 34. Although many different constructions can be used, the illustrated displacement mechanism 32 has a mounting block 36 fixed relative to the interconnecting fixture. A shaft 38 is threaded through an aperture in the mounting block 36 and carries a pressure shoe 40 at one, inner end and is fitted with a handle 42 at its other, outer end. The block 36 is recessed to slidably seat the shoe 40, which is thus supported alongside one edge of the seated backplane 12, as shown.

FIGS. 1 and 2 show each displacement mechanism 32 with the handle 42 thereof rotated to retract the pressure shoe within the corresponding mounting block, where it is spaced from the backplane under test. Rotation of the handle 42 on one displacement mechanism 32 threads the shaft thereof further into the associated mounting block 36, which in turn moves the pressure shoe 40 thereof into engagement with and against the backplane 12. In this manner, each displacement mechanism 32 can displace the backplane 12 in the direction of its associated arrow 34 relative to the interconnecting fixture 24. As described below with reference to the remaining drawings, this relative movement brings the contacts of the assembly under test into electrical engagement with the contacts of the interconnecting fixture 24.

FIG. 3A shows that in the normal position of the backplane 12 relative to the interconnecting fixture 24, the guide pins 28 align the backplane with the fixture such that the wire-wrap pin 20 of a contact 18 telescopically interfits freely, i.e. without at least lateral interference, within a socket contact 30 of the interconnecting test fixture 24. However, as FIG. 3B shows, when the backplane 12 is displace relative to the fixture 24 in the direction of arrow 44, as effected by one displacement mechanism 32 in FIG. 1, each contact pin 20 is offset relative to the associated socket contact 30. The offset is sufficient to bring the pin into interfering engagement, and hence into electrical connection, with the socket contact. By way of illustration, a displacement of 0.030 inch is sufficient for the present embodiment.

The illustrated socket contact 30 has a tubular upper section 46 which has a tapered inner surface to form a well 48 of progressively decreasing diameter. (A vent hole 50 adjacent the base of the well ensures reliable plating of the inner surface during manufacture.) Contiguously below the tubular section, the contact 30 has a mounting section 52 which seats the contact in a mounting panel 54 of the test fixture. Below the mounting section, a lower section 56, typically a wire-wrap pin, connects the socket contact 30 to circuits within the interconnecting fixture and/or the test instrument 26 (FIG. 1).

The illustrated interconnecting fixture 24 has sufficient panel thickness to mount the socket contact 30 and to shield the tubular upper section 46 of each contact from damage. The illustrated fixture 24 is built up to this thickness with a protective panel 58 which overlies the mounting panel 54 and is apertured with clearance holes within which the contact upper sections are recessed.

With further reference to FIGS. 3A and 3B, the interconnecting test fixture 24 seats the backplane 12 by receiving the contact pins 20 within the wells of the socket contacts 30. Each well is sufficiently large in diameter, to receive a pin without interference. This telescopic interfitting of the contacts of the assembly under test without interference within the contacts of the interconnecting test fixture allows the assembly to be installed on the test fixture with minimal force or pressure. This is in sharp contrast to prior structures, which require significant and sometimes undue and potentially damaging force normal to the plane of the backplane or circuit board being tested.

As previously noted, when a displacement mechanism 32 of FIG. 1 moves the backplane 12 laterally as FIG. 3B shows, each contact pin 20 is offset sufficiently to engage the side of the contact well 48 in which it is seated. The illustrated contact pin 20 is sufficiently flexible to bend upon engagement with the socket contact, hence the engagement is resilient. This flexibility of the engagement between each contact of the assembly under test and the mating contact of the test fixture relaxes the machanical tolerances required to attain secure and reliable electrical engagement between the mating contacts. Further, it provides a wiping or sliding motion between the engaged contact surfaces, which enhances the quality of electrical contact between them. The force required to effect this electrical contact is confined to the planar dimension of the backplane 12, which is the direction in which this structure has significant strength.

The result of the mechanism thus detailed in FIGS. 3A and 3B is that the assembly under test is electrically connected in the desired manner with the test fixture with relative ease and minimal applied forces, and with minimal likelihood of damage to the electrical structures involved. In one preferred practice of the invention, the assembly under test is first shifted in one direction as illustrated in FIG. 3B and tested, after which the assembly is shifted in the other direction, i.e. opposite to arrow 44 in FIG. 3B, by means of the other displacement mechanism and the electrical test repeated. Identical results on both tests generally indicate that the assembly undet test is in fact making good contact with the test fixture 24. Upon completion of the testing, the backplane 12 can be removed from the fixture 24 with essentially no resistance other than its weight.

FIG. 4 shows a socket contact 60 similar to the contact 30 of FIGS. 3A and 3B but having a shallower well 62. This shallow socket contact can be used where it is not necessary, or not desirable, that the wire-wrap pin or other male element of contact 18 extend deeply into the socket contact. The well in the socket contact 60 is sufficiently wide to receive, and to engage, a wire-wrap connection adjacent the bottom end of the contact 18.

Turning to FIG. 5, when the assembly under test has short contact pins 63, or pins that otherwise have relatively little flexibility, the interconnecting fixture can have a socket contact 64 which has a flexible stem 66 between the tubular well-forming upper secion 68 and the mounting section 70. Upon displacement of the backplane 12 from the normal position to the position which FIG. 5 shows, the engagement of the rigid contact pin 63 with the socket contact 64 bends the stem 66 to provide the desired flexibility of the engagement between the two mated contacts.

FIG. 5 also shows an optional panel 72 which protects the contact 64 and supports the contact upper section 68 during loading of an electrical assembly onto the fixture 24. The illustrated panel 72 is disposed over the mounting and protective panels 54, 58, and has through holes 74 through which the contact stems 66 can pass for free deflection of the contact.

The panel 72 is maintained laterally positioned in alignment with the mounting panel 54 but is movable in the transverse (vertical) direction between a raised position 72a (shown fragmentarily with broken lines) and a lower position shown with solid lines. A locating mechanism (not shown) constructed with known skills can be provided to support the panel in this manner and to raise it to the upper position except when the backplane 12 or another assembly is being tested. By way of example, the panel 72 can be slidably seated on the guide pins 28 (FIG. 1) and lightly spring-loaded to the upper position so that it can readily be depressed to the lower position.

When the locating panel 72 is raised to the upper position 72a, the sides of the though hole 74 progressively engage the contact upper section, starting with a tapered portion 68a, to center the contact at the desired location, should it be offset. Further, when in the upper position, the panel shields the contact upper sections from damage. When a backplane 12 is loaded onto the test fixture, the locating panel 72 is lowered to the position shown with solid lines. This leaves the contact upper section 68 free to deflect when the backplane is shifted laterally, as in FIG. 5.

When the assembly to be tested is a printed wire board 78 as shown in FIG. 6A and the contact thereon to be tested is a female contact element such as a receptacle formed by a plated-through hole 80, the interconnecting test fixture 24 is fitted with a pin contact 82 that penetrates and electrically engages the plated-through hole 80. The pin contact has a mounting section, that seats in the fixture 24, from which a flexible stem section 84 extends upwardly. An enlarged locating collar 86 having conically tapered upper and lower surfaces is at the upper end of the stem section, and a pin 88 extends upwardly from it, as shown. As is the case with the test contacts 30, 60 and 64 shown in FIGS. 3, 4 and 5, these sections of the FIG. 6 contact 82 are spaced along a common axis of elongation which extends transverse to the lateral dimensions of the electrical assembly being tested.

The pin section of the contact 82 fits freely within the plated hole 80 without interference, when the circuit board 78 is in the normal position shown in FIG. 6A. However, when the circuit board 78 is displaced as to the left along arrow 90 as in FIG. 6B, the pin interferingly engages the conductive plating in the hole 80, and the contact stem section 84 bends. The plated hole is thereby electrically connected, with resilient pressure, to the contact 82.

Figure 6B:
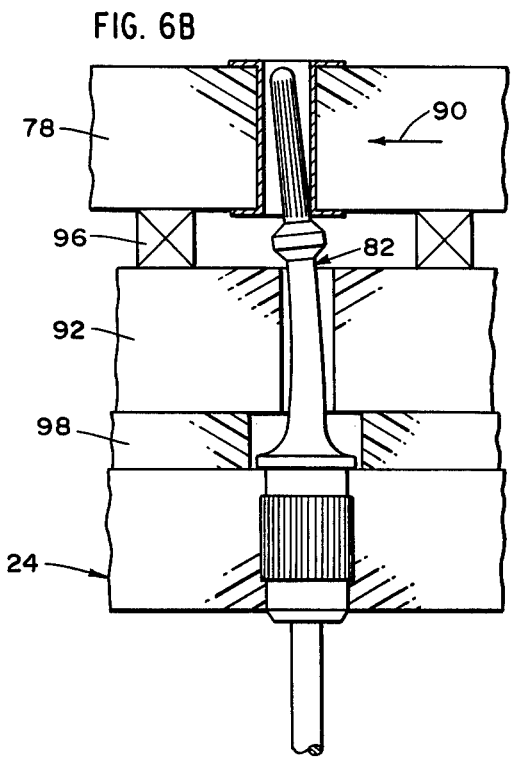

FIGS. 6A and 6B also show that, where desired, a protective panel 92 can be employed to protect the contacts 82, and particularly the pin section 88, during loading of the circuit board 78 being tested. At the location of each contact 84, the protective panel 92 is apertured with through holes dimensioned to pass closely over each locating collar 86. The panel 92 is movable between an upper, contact-shielding, position shown in FIG. 6A, where its upper surface is at least at the level of the upper end of contact 82, and a lower position shown in FIG. 6B. In the lower position, the panel 92 is fully below both the pin section 88 and the locating collar 86, so that it does not interfere with flexing of the contact by displacement of the printed circuit board being tested. As the panel 92 moves between these positions, it passes over the locating collar of the contact, and thereby aligns the contact pin section 88. In particular, with the configuration shown in FIG. 6A, downward placement of the printed wiring board 78, onto the test fixture from the position shown in FIG. 6A, depresses the protective panel 92 into engagement with the locating collar 86. The panel thereby ensures alignment of the contact simultaneous with entry of the pin thereof into the plated hole 80.

FIG. 6A indicates a locating mechanism 94 for providing the above operation and motion of the protective panel 92. The locating mechanism can employ spring-loading which accommodates travel of the panel between the positions of FIGS. 6A and 6B. Alternatively, the mechanism can employ hydraulic pressure.

With whatever structure is used, a spacer 96 can be provided between the circuit board 78 and the panel 92, and a further spacer 98 provided between the panel 92 and the mounting panel 54 below it. As FIGS. 6B shows, the upper spacer 96 separates the board 78 being tested from the protective panel 92 by the height of the aligning collar 86. This allows the contact 82 to flex, upon displacement of the printed wiring board, without interference of the collar 86 by the panel 92. The thickness of the lower spacer 98 is selected to limit the downward placement of the printed wiring board 78 on the fixture 24 to the level shown in FIG. 6B.

The spacers 96 and 98 in FIGS. 6A and 6B thus are illustrative of structures that bring the passage in the panel 92 into aligning engagement with the contact collar 86 as the printed wiring board is seated onto the contact pin, and yet leave the collar free of restriction when the circuit board is fully seated. Further, the protective panel and the circuit board are preferably located at selected levels by the positive seating against the mounting panel, whether by means of the illustrated spacer 98 or otherwise.

It will thus be seen that the invention provides an interconnecting fixture which has alignment means for receiving an electrical assembly and for locating the assembly so that contacts of the fixture can telescopically interfit without interference in the lateral direction with mating contacts of the assembly. The interconnecting fixture further has a displacement mechanism for moving the seated electrical assembly laterally to bring each pair of telescopically interfitting contacts into mechanical interfering engagement, thereby providing electrical connection between them. The invention thus attains the objects set forth above and those made apparent from the preceding description. Since certain changes may be made in the above constructions without departing from the scope of the invention, all matter contained in the above description as shown in the accompanying drawings shall be interpreted as illustrative and not in a limiting sense.

The following claims are intended to cover the generic and the specific features of the invention, and all statements of the scope of the invention which, as a matter of language, might be said to fall therebetween.

Having described the invention what is claimed as new and secured by Letters Patent is:

1. An electrical testing apparatus adapted to reliably test an electrical unit characterized by a group of unit contact surfaces which conprises alignment means for predeterminedly positioning said unit relative to said apparatus, a group of apparatus contact surfaces carried by said apparatus, said unit contact surfaces and said apparatus contact surfaces being spaced from one another and extending in the same general direction during said positioning, said unit contact surfaces being one of male or hollow circular in cross-section and said apparatus contact surfaces being the other of male or circular in cross-section, and displacement means capable of producing relative movement between said unit contact surfaces and said apparatus contact surfaces in at least two directions to bring each unit contact surface into abutting relation successively one at a time with a respective apparatus contact surface in two different generally tangential line contacts therebetween, at least one of said contact surfaces being yieldably movable in the direction of said relative movement under the force applied to produce said relative movement.

* * * * *